(12) United States Patent
Shinaki et al.

(10) Patent No.: US 9,589,787 B2
(45) Date of Patent: Mar. 7, 2017

(54) MANUFACTURING METHOD OF SEMICONDUCTOR DEVICE

(71) Applicant: Renesas Electronics Corporation, Kawasaki-shi, Kanagawa (JP)

(72) Inventors: Toru Shinaki, Kanagawa (JP); Takehiko Saito, Kanagawa (JP); Yoshinori Kondo, Kanagawa (JP); Masatoshi Fukushima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 30 days.

(21) Appl. No.: 14/593,028

(22) Filed: Jan. 9, 2015

(65) Prior Publication Data

US 2015/0214106 A1    Jul. 30, 2015

(30) Foreign Application Priority Data

Jan. 28, 2014   (JP) .................................. 2014-013449

(51) Int. Cl.
| | |
|---|---|
| *H01L 21/768* | (2006.01) |
| *H01L 21/02* | (2006.01) |
| *H01L 21/311* | (2006.01) |
| *H01L 21/3213* | (2006.01) |

(52) U.S. Cl.
CPC .. *H01L 21/02071* (2013.01); *H01L 21/31138* (2013.01); *H01L 21/32138* (2013.01); *H01L 21/32139* (2013.01)

(58) Field of Classification Search
CPC ............ H01L 21/768; H01L 21/31138; H01L 21/02071; H01L 21/32139; H01L 21/32138
USPC ........................................................ 438/669
See application file for complete search history.

(56) References Cited

U.S. PATENT DOCUMENTS

| | | | |
|---|---|---|---|
| 5,298,112 A | 3/1994 | Hayasaka et al. | |
| 2004/0152302 A1* | 8/2004 | Wang ................ | H01L 21/02071 438/669 |
| 2009/0311635 A1* | 12/2009 | Chen ....................... | G03F 7/091 430/323 |

FOREIGN PATENT DOCUMENTS

| | | |
|---|---|---|
| JP | 2-49425 A | 2/1990 |
| JP | 2000-12514 A | 1/2000 |

* cited by examiner

*Primary Examiner* — Asok K Sarkar
*Assistant Examiner* — Dmitriy Yemelyanov
(74) *Attorney, Agent, or Firm* — Sughrue Mion, PLLC

(57) ABSTRACT

The present invention makes it possible to increase the reliability of a semiconductor device. A manufacturing method of a semiconductor device according to the present invention includes a step of removing a patterned resist film and the step of removing a patterned resist film includes the steps of: (A) introducing at least a gas containing oxygen into a processing room; (B) starting electric discharge for transforming the gas containing oxygen into plasma; and (C) introducing a water vapor or an alcohol vapor into the processing room. On this occasion, the step (C) is applied either simultaneously with or after the step (B).

10 Claims, 16 Drawing Sheets

MANUFACTURING METHOD OF SEMICONDUCTOR DEVICE

CROSS-REFERENCE TO RELATED APPLICATIONS

The disclosure of Japanese Patent Application No. 2014-013449 filed on Jan. 28, 2014 including the specification, drawings and abstract is incorporated herein by reference in its entirety.

BACKGROUND

The present invention relates to a manufacturing technology of a semiconductor device, for example a technology effectively applicable to a manufacturing technology of a semiconductor device having a process of patterning a conductor film containing aluminum as the main component.

A technology of patterning a conductor film containing aluminum as the main component with a resist film and successively removing the resist film is described in Japanese Unexamined Patent Application Publication No. Hei 2 (1990)-49425 (Patent Literature 1) and Japanese Unexamined Patent Application Publication No. 2000-12514 (Patent Literature 2).

CITATION LIST

Patent Literature

Patent Literature 1: Japanese Unexamined Patent Application Publication No. Hei 2 (1990)-49425
Patent Literature 2: Japanese Unexamined Patent Application Publication No. 2000-12514

SUMMARY

For example, an aluminum wire is sometimes used in a semiconductor device and the aluminum wire is formed by using a photolithographic technology and an etching technology. Concretely, a resist film is formed over a conductor film containing aluminum as the main component, exposure/development processing is applied to the resist film, and thereby the resist film is patterned. Successively, the conductor film is patterned by etching with the patterned resist film used as a mask and thereby an aluminum wire is formed.

An etching gas is used when the etching is applied and, usually at etching process, the etching is applied while a sidewall polymer for protecting against the etching is formed over the side face (sidewall) of an aluminum wire.

Meanwhile, after finishing the etching, the sidewall polymer is unnecessary and hence the sidewall polymer is removed. As a result of the studies by the present inventors however, it has been found that a part of the sidewall polymer is degenerated for some reason and, even when a step for removing the sidewall polymer is applied, a part of the degenerated sidewall polymer is not removed and remains over the side face of the aluminum wire. The remaining sidewall polymer is called a "polymer residual" in the present specification. If such a "polymer residual" exists astraddle between wires for example, short-circuit may possibly be generated between the wires through the "polymer residual". In an existing manufacturing step of a semiconductor device generating a "polymer residual" therefore, there is a room for improvement from the viewpoint of increasing the reliability of the semiconductor device.

Other problems and novel features will be obvious from the descriptions and attached drawings in the present specification.

A manufacturing method of a semiconductor device according to an embodiment includes a step of removing a patterned resist film and the step of removing a patterned resist film includes the steps of: (A) introducing at least a gas containing oxygen into a processing room; (B) starting electric discharge for transforming the gas containing oxygen into plasma; and (C) introducing a water vapor or an alcohol vapor into the processing room. On this occasion, the step (C) is applied either simultaneously with or after the step (B).

According to the embodiment, it is possible to increase the reliability of a semiconductor device.

DETAILED DESCRIPTION

Figure 1:
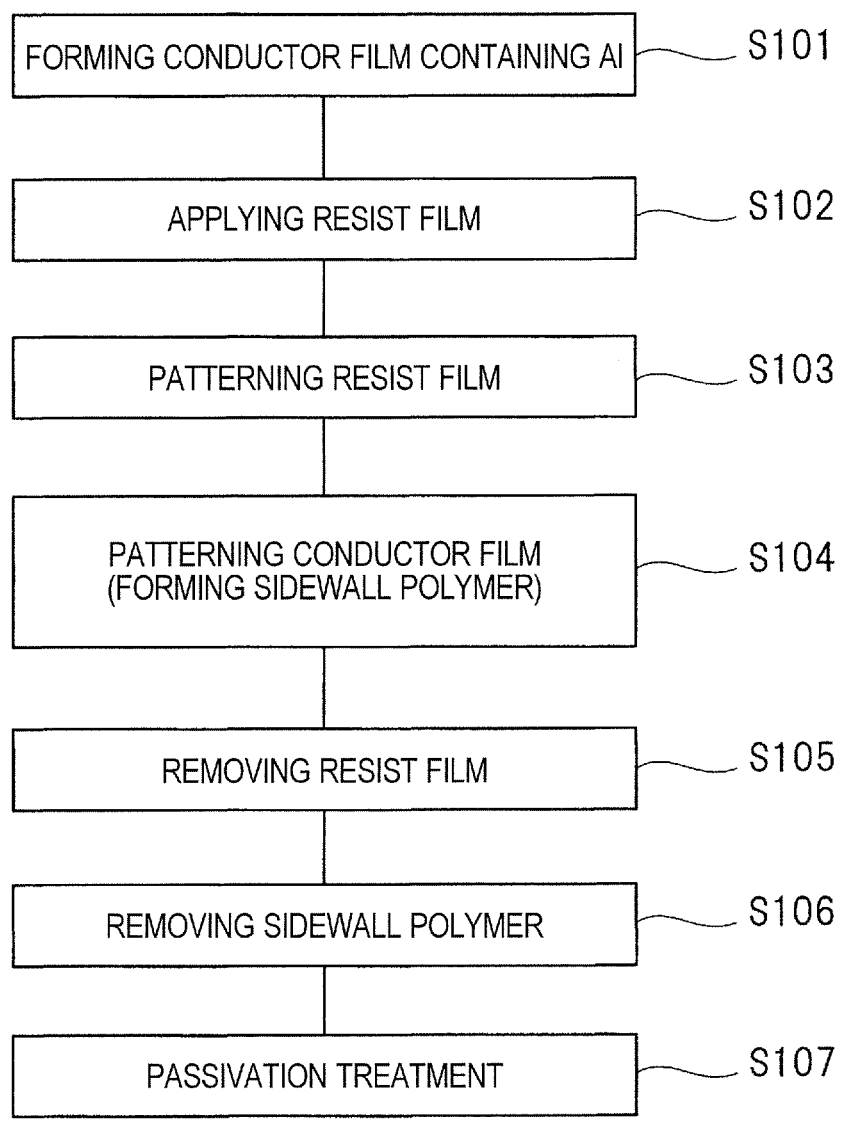
FIG. 1 is a flowchart showing the flow of a step for patterning a conductor film containing aluminum as the main component.

In the following embodiments, if necessary for convenience sake, each of the embodiments is explained by dividing it into plural sections or embodiments but, unless otherwise specified, they are not unrelated to each other and are in the relationship of one being a modified example, a detail, a supplemental explanation, or the like of a part or the whole of another.

Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Furthermore in the following embodiments, it goes without saying that the constituent components (including a component step and others) are not necessarily essential except the cases of being specified and being obviously thought to be essential in principle and other cases.

Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the numerical value and the range.

In addition, in all the drawings for explaining the embodiments, an identical member is represented with an identical code in principle and is not explained repeatedly. Further, hatching may sometimes be applied even in a plan view in order to make a drawing easy to understand.

(First Embodiment)
<Description of Related Art>

Firstly, related art as a general technology of patterning a conductor film containing aluminum as the main component is explained and a room for improvement existing in the related art is explained.

A "main component" in the present specification means a most-contained material component among the constituent components constituting a member (a layer or a film) and for example a "conductor film containing aluminum as the main component" means that the material of the conductor film contains aluminum (Al) most. The intention to use the word "main component" in the present specification is for example to express that, although a conductor film basically comprises aluminum, the case of additionally containing an impurity is not excluded.

When attention is focused on an aluminum wire used generally in a semiconductor device for example, the aluminum wire is configured usually in the manner of interposing an aluminum film with barrier conductor films comprising titanium/titanium nitride films. That is, the aluminum wire comprises a first barrier conductor film, an aluminum film formed over the first barrier conductor film, and a second barrier conductor film formed over the aluminum film. On this occasion, when the laminated film comprising the first barrier conductor film, the aluminum film, and the second barrier conductor film is called a conductor film, the aluminum film accounts for the most part of the conductor film and hence the conductor film comes to be a "conductor film containing aluminum as the main component".

Further, an aluminum film described in the present specification is used not only in the case of a pure aluminum film but also for a wide concept including an aluminum alloy film formed by adding silicon to aluminum (AlSi film) and an aluminum alloy film formed by adding silicon and copper to aluminum (AlSiCu film) and those aluminum alloy films are also included in the "conductor film containing aluminum as the main component". That is, the term "conductor film containing aluminum as the main component" described in the present specification is used for both a conductor film containing an aluminum film and barrier conductor films and the case where an aluminum film itself is an aluminum alloy film.

FIG. 1 is a flowchart showing the flow of a step for patterning a conductor film containing aluminum as the main component. The outline of the step for patterning a conductor film containing aluminum as the main component is explained along the flowchart.

Firstly, a conductor film containing aluminum (Al) is formed over a base film by using a sputtering method for example (S101). Successively, a resist film is applied over the conductor film by using a spin coating method for example (S102). Then the resist film is patterned by using a photolithographic technology (S103). The patterning of the resist film is carried out so that wire forming parts may be covered with the resist film and the other parts may be exposed through the resist film. Successively, the conductor film is patterned by etching with the patterned resist film used as a mask (S104). Concretely, although an etching gas is used at the process for etching a conductor film, generally at the step for etching the conductor film, the etching is carried out while a sidewall polymer for protecting against etching is formed over the side face of the conductor film by introducing a gas for forming the sidewall polymer together with the etching gas. Successively, after the patterned resist film is removed (S105), the sidewall polymer formed over the side face of the conductor film is removed (S106). Successively, passivation treatment for oxidizing the surface of the patterned conductor film is applied (S107). The patterning of a conductor film containing aluminum as the main component is carried out in this way.

As a result of studies by the present inventors on related art however, it has been found that, even when the step for removing a sidewall polymer is applied, a part of the sidewall polymer is not removed and remains over the side face of a patterned conductor film. If such a "polymer residual" exists astraddle between the patterned conductor films (wires) for example, short-circuit may possibly be generated between the patterned conductor films through the "polymer residual". Further, the side face part of a conductor film covered with a "polymer residual" may possibly not be passivated and the corrosion resistance may remain low even when passivation treatment is applied. Furthermore, after a conductor film is patterned, an interlayer insulation film is formed so as to cover the patterned conductor film but, if a "polymer residual" exists, the interlayer insulation film is not formed at the lower part of the "polymer residual" and a void (gap) may possibly be generated. If such a void is generated, the part of the conductor film touching the void is not fixed with the interlayer insulation film and electromigration tends to occur at the part. By the related art therefore, the reliability of a semiconductor device deteriorates. It is obvious therefore that there is a room for improvement at the existing manufacturing step of a semiconductor device causing a "polymer residual" to be generated from the viewpoint of increasing the reliability of the semiconductor device.

In this regard, the present inventors have investigated a method for solving the problem existing in the related art. Firstly, from the phenomenon of a part of a sidewall polymer remaining over the side face of a patterned conductor film without being removed even when a step for removing the sidewall polymer is applied, the present inventors have estimated that the problem existing in the related art may be solved by improving the step for removing the sidewall polymer. As a result of investigating a "polymer residual" in detail however, the present inventors have found that a part of a sidewall polymer is degenerated for some reason and a "polymer residual" is generated. In other words, it has been found that a "polymer residual" is a substance formed by degenerating a sidewall polymer and the "polymer residual" different from the sidewall polymer is hardly removable even when the step for removing the sidewall polymer is improved. That is, the present inventors have concluded that a "polymer residual" cannot be eliminated by the improvement of the step for removing a sidewall polymer and, in order to eliminate a "polymer residual", it is necessary to clarify the generating mechanism of a "polymer residual" thoroughly and use ingenuity so as not to generate the "polymer residual".

The present inventors have therefore: studied earnestly; obtained knowledge on the generating mechanism of a "polymer residual"; and used ingenuity for inhibiting the "polymer residual" from being generated on the basis of the obtained knowledge. The generating mechanism of a "polymer residual" clarified by the present inventors is firstly explained and then the technological thought in First Embodiment in which the ingenuity for inhibiting the "polymer residual" from being generated is used is explained hereunder. The technological thought in First Embodiment is a technological thought attained on the basis of the generating mechanism of a "polymer residual" clarified by the present inventors.

<Generating Mechanism of "Polymer Residual">

As a result of the studies by the present inventors, it has been found that the cause of the "polymer residual" generation lies in the step for removing a resist film applied after the step for patterning a conductor film containing aluminum as the main component. More specifically, it has been found that the water vapor introduced into a processing room at the step for removing a resist film causes a "polymer residual" to be generated. The mechanism of generating a "polymer residual" due to the water vapor introduced into a processing room at the step for removing a resist film is explained hereunder in reference to drawings.

Figure 2:
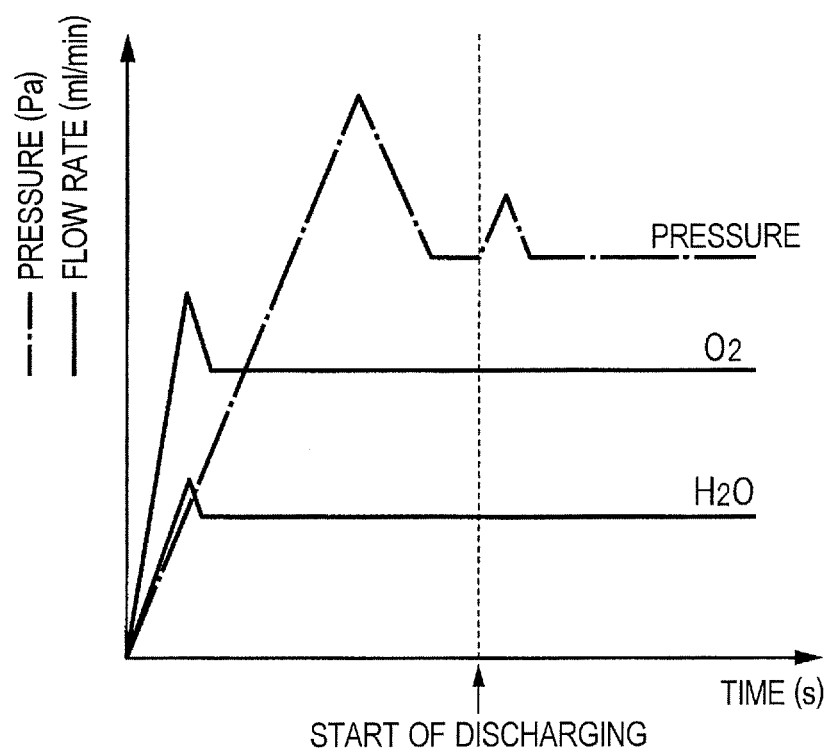
FIG. 2 is a graph showing the state of a gas introduced into a processing room at a step for removing a resist film.

FIG. 2 is a graph showing the state of a gas introduced into a processing room at a step for removing a resist film. As shown in FIG. 2, firstly an oxygen gas ($O_2$ gas) and a water vapor ($H_2O$) are introduced into a processing room at a step for removing a resist film. Successively, when the pressure in the processing room is stabilized, electric discharge for transforming the oxygen gas and the water vapor into plasma starts. Then the resist film is removed by the oxygen gas transformed into plasma. The step for removing the resist film is hereunder explained concretely.

Figure 3:
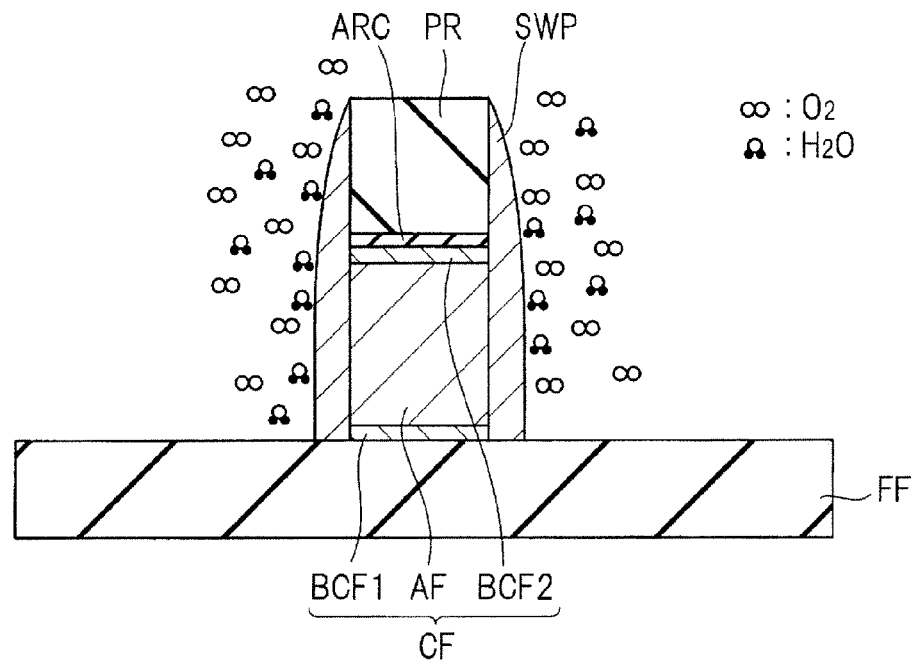
FIG. 3 is a schematic view explaining a mechanism of generating a "polymer residual".

As shown in FIG. 3, after finishing the patterning of a conductor film, a patterned conductor film CF is formed over a base film FF. The conductor film CF comprises for example: a barrier conductor film BCF1 comprising a titanium/titanium nitride film; an aluminum film AF formed over the barrier conductor film BCF1; and a barrier conductor film BCF2 comprising a titanium/titanium nitride film and being formed over the aluminum film AF. Then over the conductor film CF, for example an antireflection film ARC comprising a silicon oxynitride film is formed and a resist film PR is formed over the antireflection film ARC. Further, a sidewall polymer SWP is formed over the side face of the conductor film CF. Then a step for removing the resist film is applied in order to remove the resist film PR formed over the conductor film CF.

At the step for removing the resist film, firstly a semiconductor substrate (semiconductor wafer) is carried in a processing room. Then an oxygen gas and a water vapor are introduced into the processing room in which the semiconductor substrate is carried. In FIG. 3, the situation where oxygen molecules configuring the oxygen gas and water molecules configuring the water vapor are dispersing around the patterned conductor film CF and the resist film PR formed over the conductor film CF is shown schematically. Here, the oxygen gas is an ashing gas introduced for the purpose of ashing the resist film PR and the water vapor is introduced for the purpose of improving corrosion resistance by dehalogenating halogen contained in the sidewall polymer SWP and passivating aluminum (Al) contained in the sidewall polymer SWP. The water vapor is introduced into the processing room in the state of vapor by heating or bubbling for example.

Figure 4:
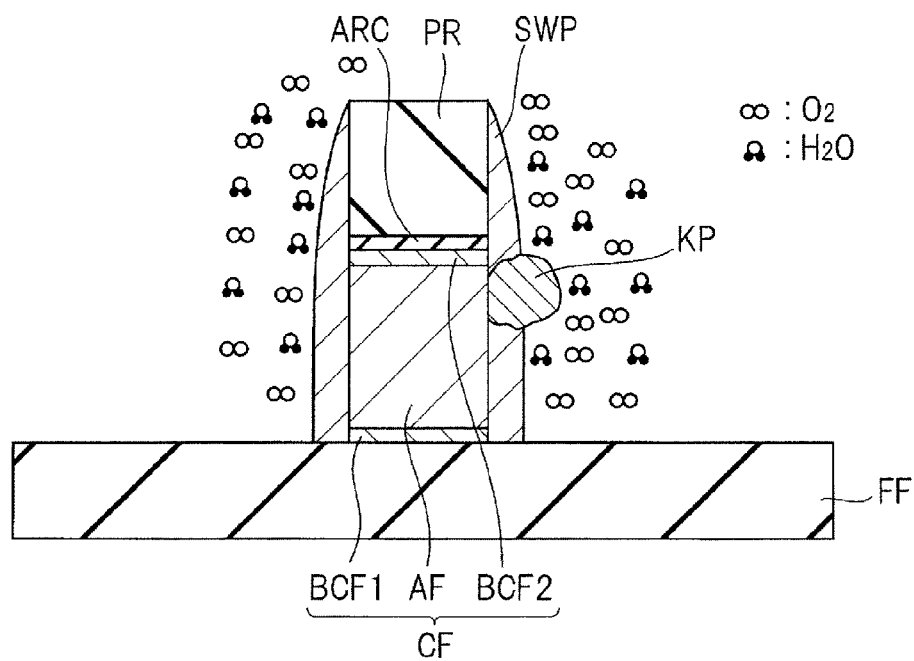
FIG. 4 is a schematic view explaining the mechanism of generating the "polymer residual".

In the related art, an oxygen gas and a water vapor are introduced into a processing room before electric discharge starts. As shown in FIG. 4 therefore, oxygen molecules and water molecules exist around a sidewall polymer SWP. On this occasion, it is estimated for example that the water molecules attach to the surface of the sidewall polymer SWP. On this occasion, the sidewall polymer SWP absorbs the water molecules, thereby swells, and is degenerated. As a result, a polymer residual KP having been degenerated from the sidewall polymer SWP by absorbing the water molecules is formed at a part of the sidewall polymer SWP. That is, in the related art, the absorption of the water molecules configuring the water vapor by the sidewall polymer SWP causes a polymer residual KP to form.

Figure 5:
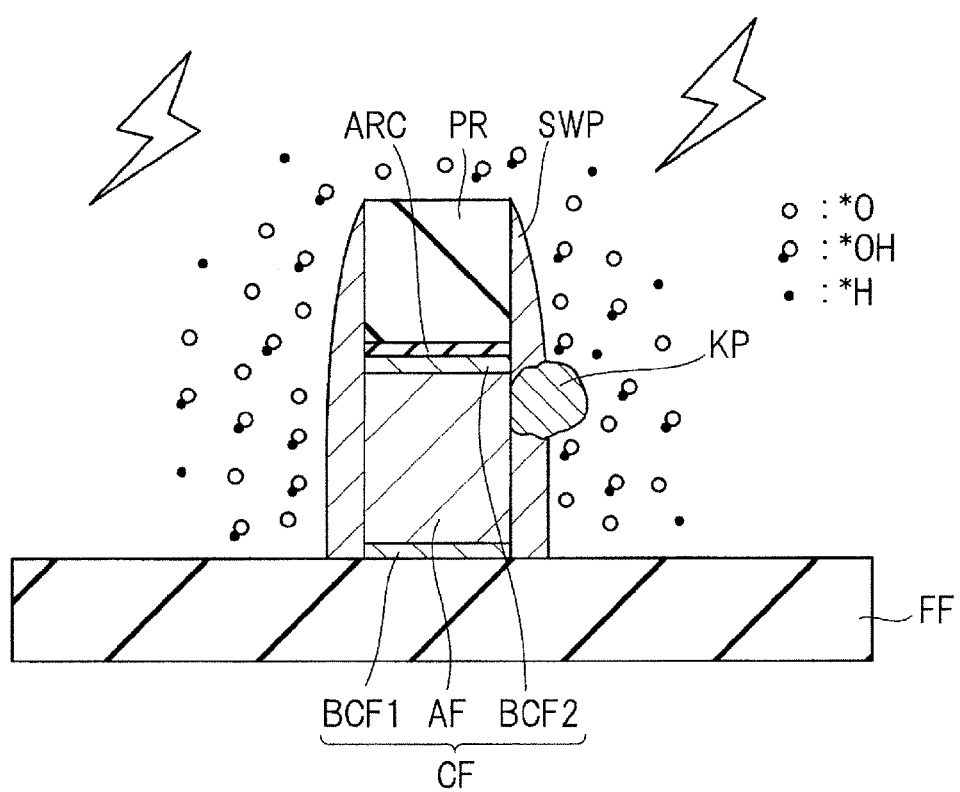
FIG. 5 is a schematic view explaining the mechanism of generating the "polymer residual".
Figure 6:
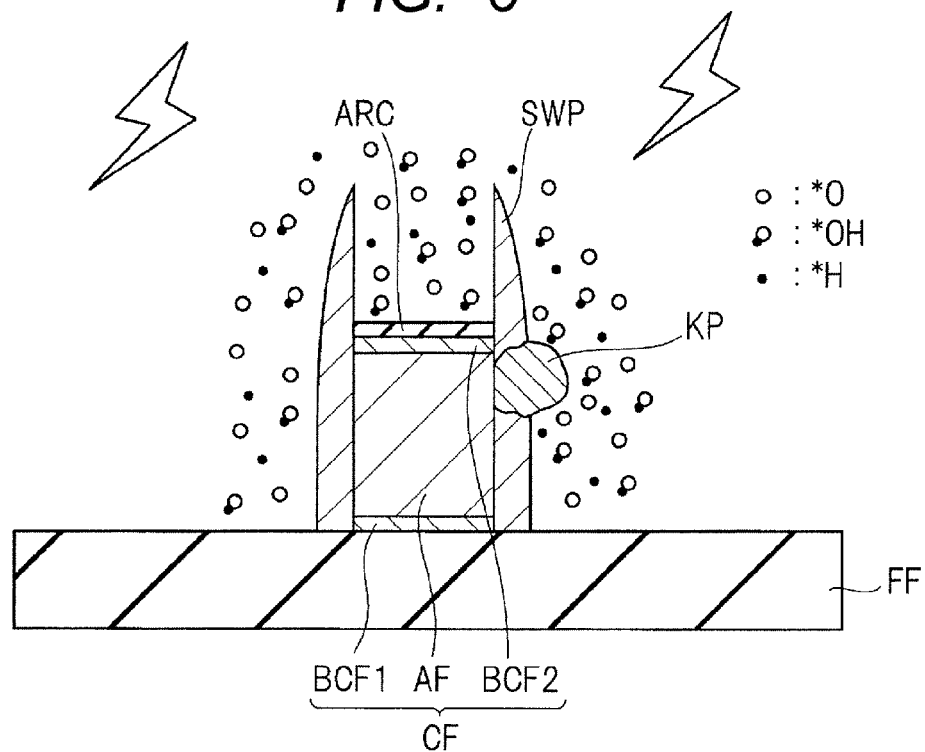
FIG. 6 is a schematic view explaining the mechanism of generating the "polymer residual".

Successively as shown in FIG. 5, electric discharge (ignition) starts in order to transform the oxygen gas and the water vapor introduced into the processing room into plasma. The oxygen gas and the water vapor are thereby transformed into plasma. Concretely, as shown in FIG. 5, O radicals (*O), OH radicals (*OH), and H radicals (*H) are formed. As a result, as shown in FIG. 6, the resist film PR is removed by the O radicals, the OH radicals, and the H radicals.

Figure 7:
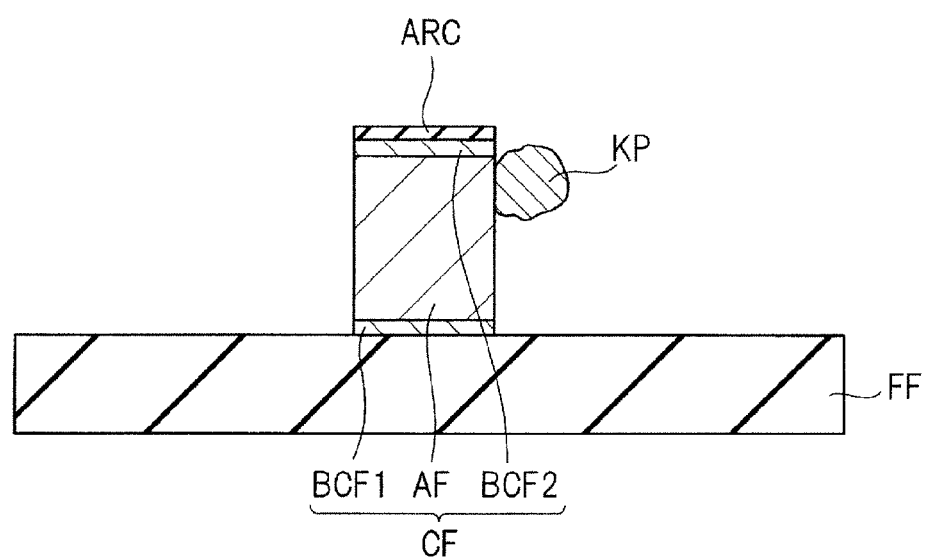
FIG. 7 is a schematic view explaining the mechanism of generating the "polymer residual".

In this way, the step for removing the resist film is applied. Successively as shown in FIG. 7, the sidewall polymer SWP is removed for example by using a chemical liquid comprising a mixed liquid of ammonium, acetic acid, and water, an aqueous solution of an ammonium fluoride base, or the like. The polymer residual KP however comprises a component different from the sidewall polymer SWP, hence is not removed, and remains over the side face of the conductor film CF even after the step for removing the sidewall polymer SWP is applied. As a result, in the related art, the possibility that the reliability of a semiconductor device deteriorates increases due to the polymer residual KP remaining over the side face of the conductor film CF.

As stated above, it is estimated that the main factor causing a polymer residual KP to be generated is that a sidewall polymer SWP absorbs water molecules, thereby swells, and is degenerated. That is, it can be thought that, in the related art, a water vapor is introduced into a processing room together with an oxygen gas, the water molecules configuring the water vapor attach to the sidewall polymer SWP, and that causes a polymer residual KP to be generated. Consequently, it is estimated that the water vapor that is the supply source of the water molecules is not introduced into the processing room in order not to generate the polymer residual KP but, if the water vapor is not introduced into the processing room, it comes to be difficult to improve corrosion resistance by dehalogenating halogen contained in the sidewall polymer SWP and passivating aluminum (Al) contained in the sidewall polymer SWP.

In First Embodiment therefore, on the premise of introducing a water vapor having the function of improving corrosion resistance by dehalogenating halogen contained in a sidewall polymer SWP and passivating aluminum (Al) contained in the sidewall polymer SWP into a processing room, ingenuity is used in inhibiting the sidewall polymer SWP from absorbing water molecules, thereby swelling, and being degenerated. That is, in First Embodiment, after the mechanism of generating a polymer residual KP is grasped accurately, ingenuity is used so as not to generate the cause of the polymer residual, which is the absorbance of water molecules by the sidewall polymer SWP, to the greatest possible extent. The technological thought of using the ingenuity in First Embodiment is explained hereunder.

<Manufacturing Method of Semiconductor Device in First Embodiment>

Figure 8:
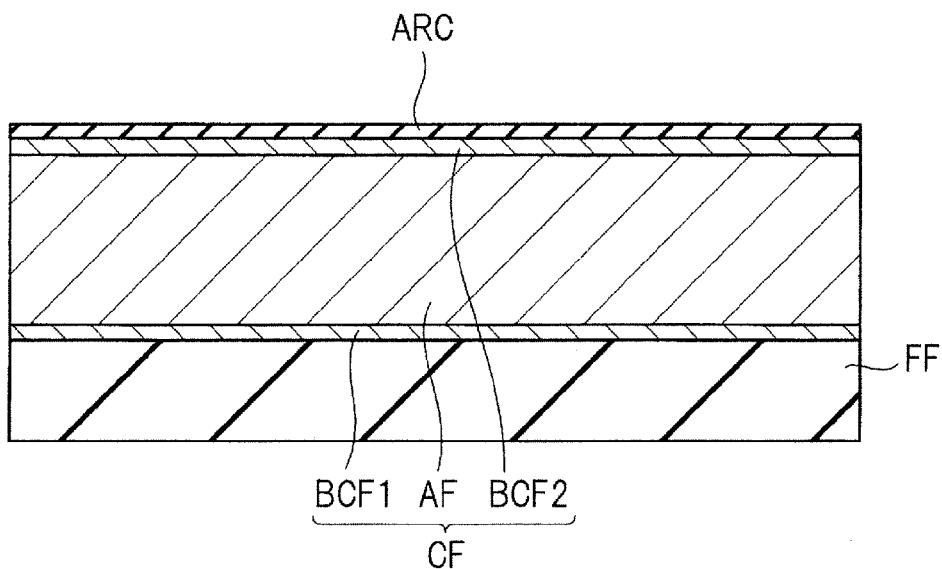
FIG. 8 is a sectional view explaining a step for patterning a conductor film in First Embodiment.

Firstly as shown in FIG. 8, a conductor film CF containing aluminum as the main component for example is formed over a base film FF comprising a silicon oxide film formed over a semiconductor substrate (semiconductor wafer). The conductor film CF for example comprises a barrier conductor film BCF1, an aluminum film AF formed over the barrier conductor film BCF1, and a barrier conductor film BCF2 formed over the aluminum film AF. Each of the barrier conductor film BCF1 and the barrier conductor film BCF2 for example comprises a titanium/titanium nitride film that is a laminated film of a titanium film and a titanium nitride film and can be formed by using a sputtering method for example. Meanwhile, the aluminum film AF for example comprises pure aluminum, an aluminum alloy (AlSi) formed by adding silicon to aluminum, or an aluminum alloy (AlSiCu) formed by adding silicon and copper to aluminum and can be formed by using a sputtering method for example.

Then as shown in FIG. 8, an antireflection film ARC is formed over the conductor film CF. The antireflection film ARC for example comprises a silicon oxynitride film and is formed by using a CVD (Chemical Vapor Deposition) method for example.

Figure 9:
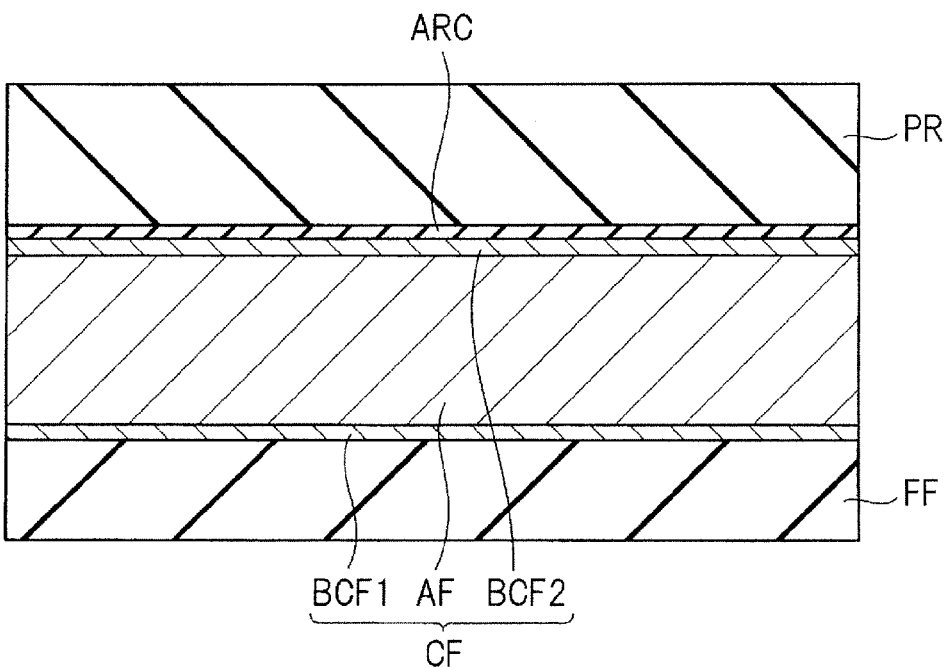
FIG. 9 is a sectional view explaining the step for patterning the conductor film following FIG. 8.
Figure 10:
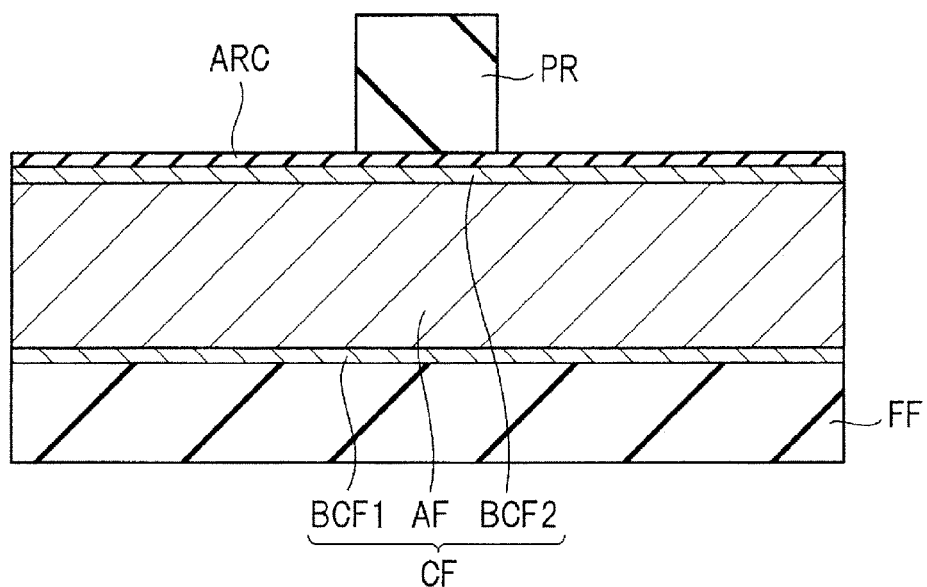
FIG. 10 is a sectional view explaining the step for patterning the conductor film following FIG. 9.

Successively as shown in FIG. 9, a resist film PR is formed over the antireflection film ARC by using a spin coating method for example. Successively as shown in FIG. 10, the resist film PR is patterned by using a photolithographic technology. The resist film PR is patterned for example in the manner of covering wiring forming parts with the resist film and exposing the other parts through the resist film.

Figure 11:
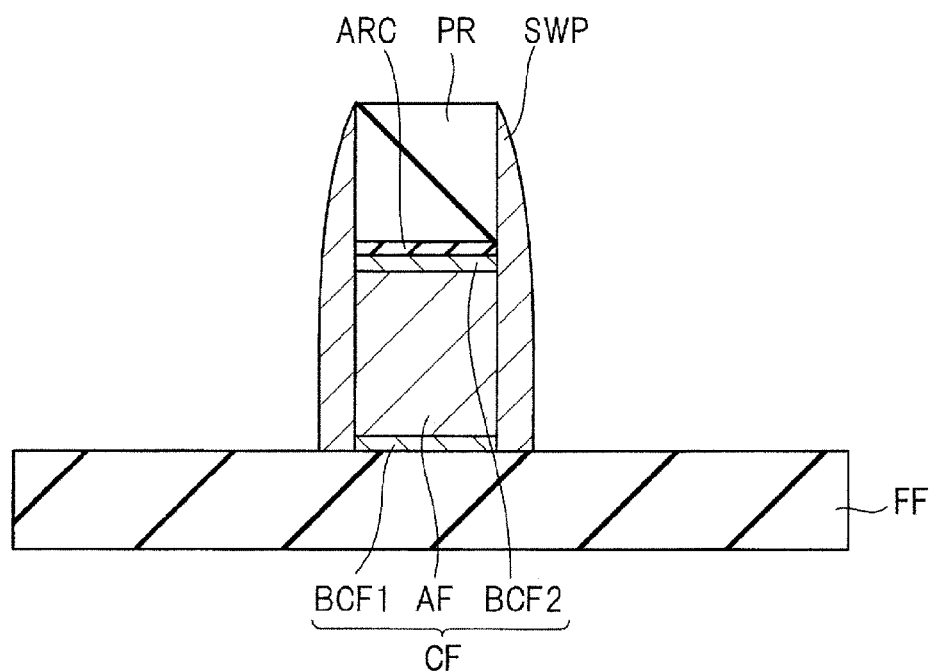
FIG. 11 is a sectional view explaining the step for patterning the conductor film following FIG. 10.

Successively as shown in FIG. 11, the conductor film CF containing aluminum as the main component is patterned by etching with the patterned resist film PR used as a mask. Concretely, a semiconductor substrate over which the conductor film CF is formed is carried in a processing room and an etching gas is introduced into the processing room. As the etching gas, for example a chlorine-based gas represented by $Cl_2$, $BCl_3$, or $CCl_4$ is used. Further, at the step for patterning the conductor film CF, the patterning is carried out while a sidewall polymer SWP for protecting against etching is formed over the side face of the conductor film CF by introducing a gas for forming the sidewall polymer together with the etching gas. As the gas for forming the sidewall polymer, for example methane ($CH_4$) or ethylene ($C_2H_4$) is used. In this way, at the step for patterning the conductor film CF, not only the etching gas but also the gas for forming a sidewall polymer is introduced and moreover argon (Ar) functioning as a dilution gas is also introduced into the processing room.

In this way, the part of the conductor film CF not covered with the resist film PR reacts with the introduced etching gas and is etched. In contrast, the part of the conductor film CF covered with the resist film PR is not exposed to the etching gas and hence is not etched. As a result, the conductor film CF is patterned in conformity with the patterned resist film PR. On this occasion, a sidewall polymer SWP is formed over the side face of the conductor film CF being patterned by a gas for forming a sidewall polymer and the etching from the side face of the conductor film CF is inhibited by the sidewall polymer SWP. That is, the side face of the conductor film CF being patterned is protected against etching by forming the sidewall polymer SWP over the side face of the conductor film CF. The sidewall polymer SWP comprises a polymer containing carbon (C) as the main component contained in the gas for forming a sidewall polymer acting as the raw material but it contains aluminum chloride and titanium chloride that are reaction products of the conductor film CF and the etching gas. In this way, the conductor film CF containing aluminum as the main component is patterned by applying etching with the patterned resist film PR used as a mask. Concretely, as shown in FIG. 11, the conductor film CF and the antireflection film ARC remain at the part covered with the resist film PR and the conductor film CF and the antireflection film ARC are etched and the base film FF is exposed at the part exposed through the resist film PR. Then the sidewall polymer SWP is formed over the side face of the remaining conductor film CF and the side face of the remaining resist film PR.

Figure 12:
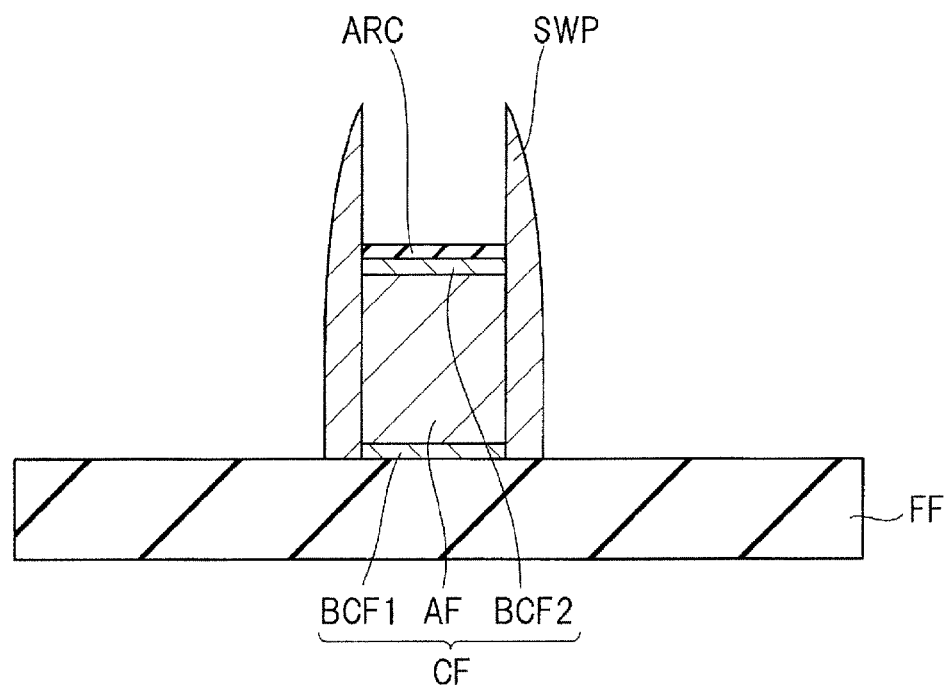
FIG. 12 is a sectional view explaining the step for patterning the conductor film following FIG. 11.

Successively as shown in FIG. 12, the resist film PR is removed. The semiconductor substrate (semiconductor wafer) is carried in the processing room at the step for removing the resist film PR. Then an oxygen gas is introduced into the processing room in which the semiconductor substrate is carried. The oxygen gas is an ashing gas introduced for the purpose of ashing the resist film PR. Here, also in First Embodiment, a water vapor is also introduced into the processing room for the purpose of improving corrosion resistance by dehalogenating halogen contained in the sidewall polymer SWP and passivating aluminum (Al) contained in the sidewall polymer SWP. In First Embodiment however, the timing of introducing the water vapor into the processing room is different from the related art. That is, a feature of First Embodiment is that the water vapor is not introduced into the processing room simultaneously with the oxygen gas but introduced into the processing room at the moment when electric discharge to the oxygen gas starts after the oxygen gas is introduced into the processing room. In First Embodiment therefore, the water vapor is introduced into the processing room at the moment when plasma is formed in the processing room. In First Embodiment thereby, the water vapor introduced into the processing room instantaneously receives energy by the plasma and dissociates into OH radicals and H radicals. This means that water molecules dissociate into OH radicals and H radicals without giving time for attaching the water molecules configuring the water vapor introduced into the processing room to the sidewall polymer SWP. In First Embodiment therefore, it is possible to inhibit the sidewall polymer SWP from absorbing water molecules, swelling, and being degenerated. That is, the technological thought according to First Embodiment is attained by focusing attention to the point that it is possible to inhibit the sidewall polymer SWP from absorbing water molecules, thereby swelling, and being degenerated by dissociating the water vapor into OH radicals and H radicals before water molecules attach to the sidewall polymer SWP. In other words, the technological thought according to First Embodiment is attained by focusing attention to the point that the sidewall polymer SWP never swells and is degenerated by dissociated OH radicals and H radicals as long as the water vapor is dissociated into the OH radicals and the H radicals.

Focusing on the point, in First Embodiment, not the water vapor is introduced into the processing room beforehand but the water vapor is introduced into the processing room at the stage of applying electric discharge to the oxygen gas and generating plasma after the oxygen gas is introduced into the processing room. In First Embodiment this way, the timing of introducing the water vapor into the processing room is later than the timing of introducing the oxygen gas into the processing room and is simultaneous with the timing of starting electric discharge (ignition) for transforming the oxygen gas into plasma. In First Embodiment consequently, since the water vapor introduced into the processing room is instantaneously exposed to the plasma atmosphere, water molecules scarcely attach to the sidewall polymer SWP and dissociate into OH radicals and H radicals. In First Embodiment therefore, as shown in FIG. 12, the resist film PR can be removed without forming a degenerated "polymer residual" in the sidewall polymer SWP.

Figure 13:
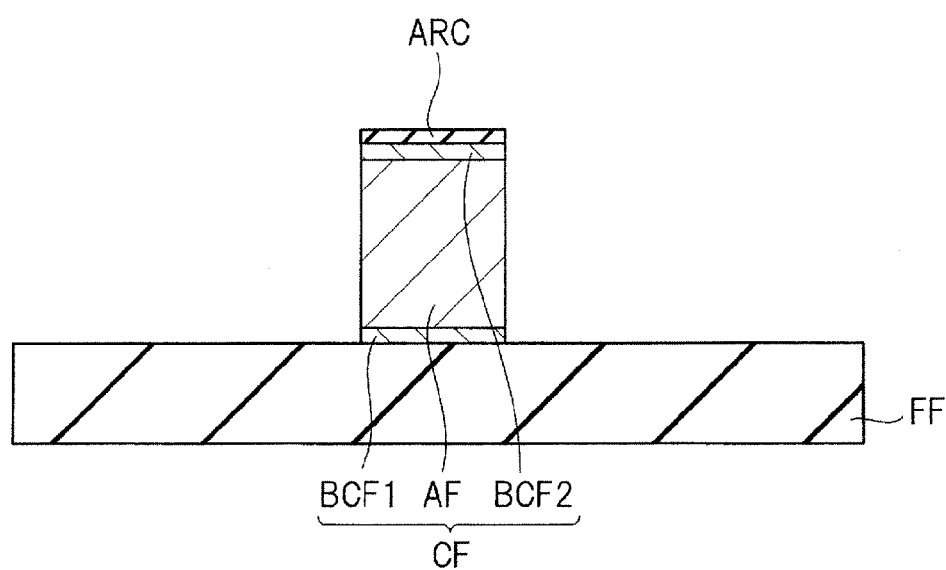
FIG. 13 is a sectional view explaining the step for patterning the conductor film following FIG. 12.

Successively as shown in FIG. 13, the sidewall polymer SWP is removed for example by using a chemical liquid comprising a mixed liquid of ammonium, acetic acid, and water, an aqueous solution of an ammonium fluoride base, or the like. On this occasion, in First Embodiment, since a "polymer residual" comprising a component different from the sidewall polymer SWP is not formed, the sidewall polymer SWP formed over the side face of the conductor film CF is removed completely while a "polymer residual" does not remain by applying the step for removing the sidewall polymer SWP. In First Embodiment thereby, it is possible to inhibit the deterioration of the reliability of the semiconductor device caused by a degenerated "polymer residual". In other words, in First Embodiment, since a degenerated "polymer residual" is not formed in the sidewall polymer SWP at the step for removing the resist film PR, it is possible to increase the reliability of the semiconductor device.

Successively, passivation treatment is applied to the exposed face of the patterned conductor film CF. Concretely, the passivation treatment is applied by introducing an oxygen gas or an ozone gas around the semiconductor wafer. As a result, the exposed face of the conductor film CF is oxidized and a passivation film is formed over the exposed face of the conductor film CF. As a result, the corrosion resistance of the conductor film CF improves. In this way, the highly-reliable patterning of the conductor film can be applied at the manufacturing step of the semiconductor device in First Embodiment.

<Feature of First Embodiment>

As stated above, a feature of First Embodiment is that a water vapor is introduced into a processing room at the moment when electric discharge starts in an oxygen gas after the oxygen gas is introduced into the processing room at a step for removing a resist film. The feature is explained hereunder in reference to drawings.

Figure 14:
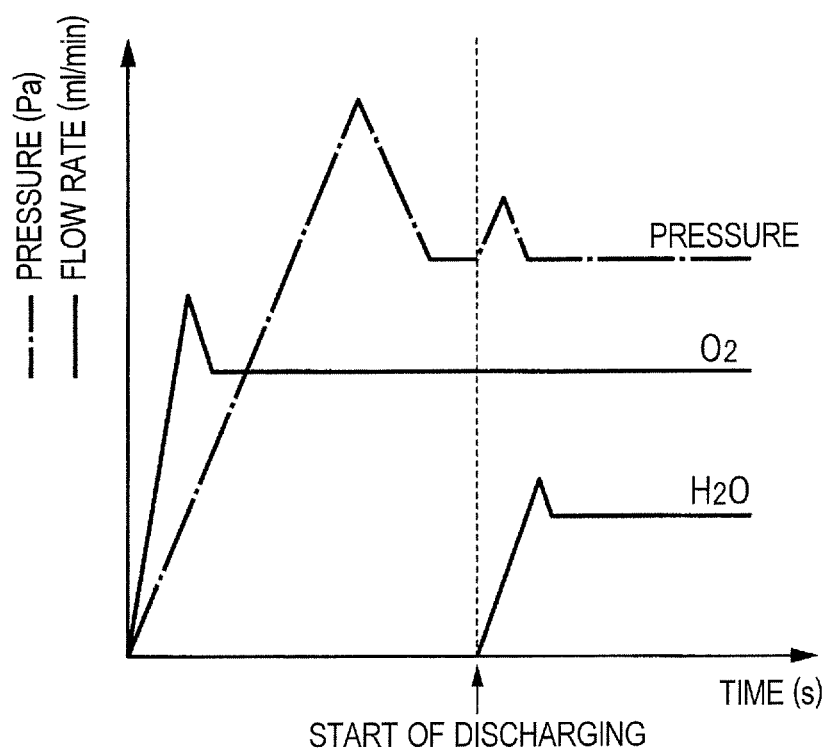
FIG. 14 is a graph showing the state of a gas introduced into a processing room at a step for removing a resist film in First Embodiment.

FIG. 14 is a graph showing the state of a gas introduced into a processing room at a step for removing a resist film in First Embodiment. As shown in FIG. 14, firstly an oxygen gas ($O_2$ gas) is introduced into a processing room at a step for removing a resist film in First Embodiment. Successively, when the pressure in the processing room is stabilized, electric discharge for transforming the oxygen gas into plasma starts and, simultaneously with that, a water vapor ($H_2O$) is introduced into the processing room. Then a resist film is removed by the oxygen gas having been transformed into plasma. In FIG. 14 for example, the pressure combining the oxygen gas and the water vapor is about 100 to 300 Pa. Further, the flow rate of the oxygen gas is about 500 to 9,000 ml/min for example and the flow rate of the water vapor is about 100 to 1,000 ml/min for example.

Figure 15:
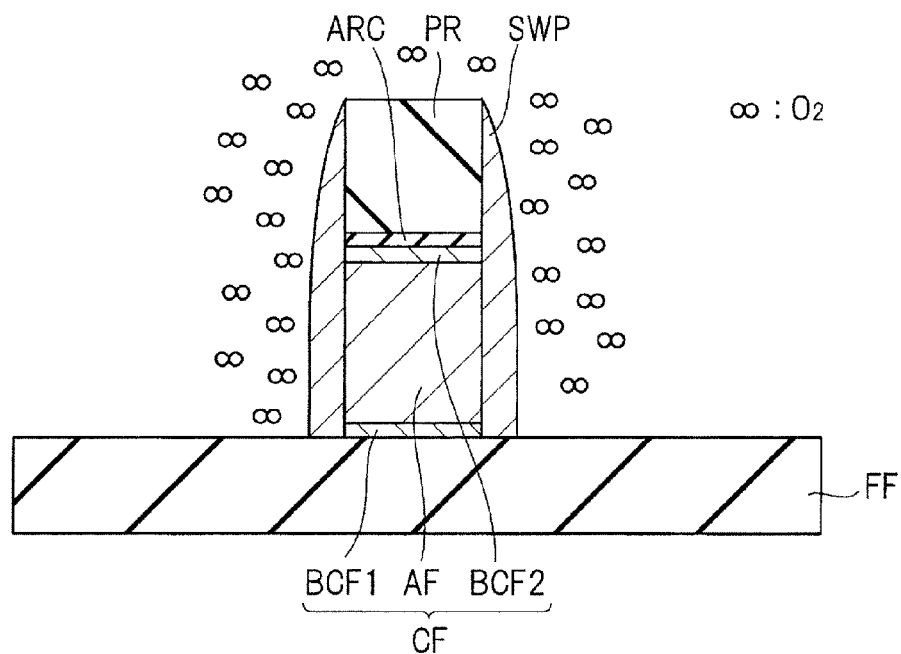
FIG. 15 is a sectional view explaining a step for removing a resist film in First Embodiment.

As shown in FIG. 15, similarly to the related art, also in First Embodiment, a patterned conductor film CF is formed over a base film FF when the patterning of the conductor film CF finishes. The conductor film CF comprises for example: a barrier conductor film BCF1 comprising a titanium/titanium nitride film; an aluminum film AF formed over the barrier conductor film BCF1; and a barrier conductor film BCF2 comprising a titanium/titanium nitride film and being formed over the aluminum film AF. Then over the conductor film CF, for example an antireflection film ARC comprising a silicon oxynitride film is formed and a resist film PR is formed over the antireflection film ARC. Further, a sidewall polymer SWP is formed over the side face of the conductor film CF. Then a step for removing the resist film PR is applied in order to remove the resist film PR formed over the conductor film CF.

At a step for removing a resist film PR in First Embodiment, firstly a semiconductor substrate (semiconductor wafer) is carried in a processing room. Then an oxygen gas is introduced into the processing room in which the semiconductor substrate is carried. In FIG. 15, the situation where oxygen molecules configuring the oxygen gas are dispersing around a patterned conductor film CF and a resist film PR formed over the conductor film CF is shown schematically. Here, the oxygen gas is an ashing gas introduced for the purpose of ashing the resist film PR. At the step for removing the resist film PR in First Embodiment, together with the oxygen gas, a gas containing fluorine such as $CF_4$ may also be introduced into the processing room. The gas containing fluorine has for example the function of increasing the speed for removing the resist film PR further than the case of not introducing the gas. Further, at the step for removing the resist film PR in First Embodiment, together with the oxygen gas, a gas containing nitrogen may also be introduced into the processing room. The gas containing nitrogen has the function of increasing the breadth of electric discharge further than the case of not introducing the gas.

Figure 16:
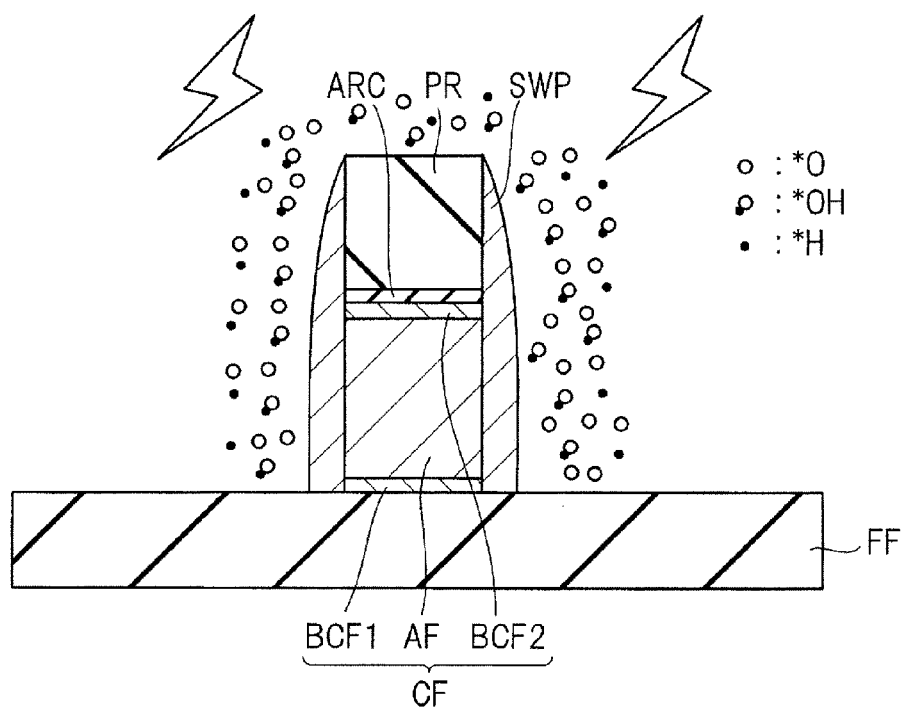
FIG. 16 is a sectional view explaining the step for removing the resist film following FIG. 15.

Successively as shown in FIG. 16, electric discharge (ignition) starts for transforming the oxygen gas introduced into the processing room into plasma. The oxygen gas is thereby transformed into plasma. In First Embodiment further, a water vapor is introduced into the processing room at the same time as the electric discharge (ignition) starts for transforming the oxygen gas into plasma. The water vapor has the function of improving corrosion resistance by dehalogenating halogen contained in the sidewall polymer SWP and passivating aluminum (Al) contained in the sidewall polymer SWP. The water vapor is introduced into the processing room in the state of a vapor by heating or bubbling for example.

Figure 17:
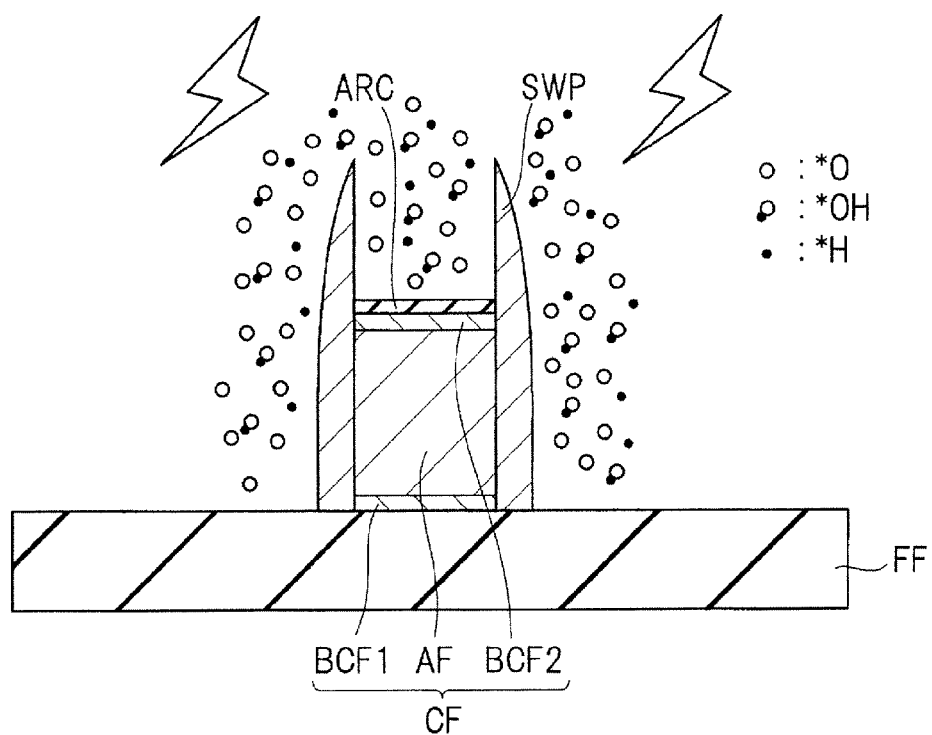
FIG. 17 is a sectional view explaining the step for removing the resist film following FIG. 16.

In First Embodiment here, since the water vapor introduced into the processing room is instantaneously exposed to the plasma atmosphere, water molecules scarcely attach to the sidewall polymer SWP and dissociate into OH radicals and H radicals. In First Embodiment therefore, it is possible to inhibit a degenerated "polymer residual" from being formed in the sidewall polymer SWP. In First Embodiment this way, since O radicals (*O) are formed by transforming the oxygen gas into plasma and the water vapor is introduced into the processing room at the same time as a plasma atmosphere is formed by the oxygen gas transformed into plasma, as shown in FIG. 16 the water vapor receives energy from the plasma atmosphere instantaneously and dissociates into OH radicals (*OH) and H radicals (*H). As a result, as shown in FIG. 17, the resist film PR is removed by the O radicals, the OH radicals, and the H radicals. By those radicals further, the dehalogenation of halogen contained in the sidewall polymer SWP and the passivation of aluminum (Al) contained in the sidewall polymer SWP advance.

Figure 18:
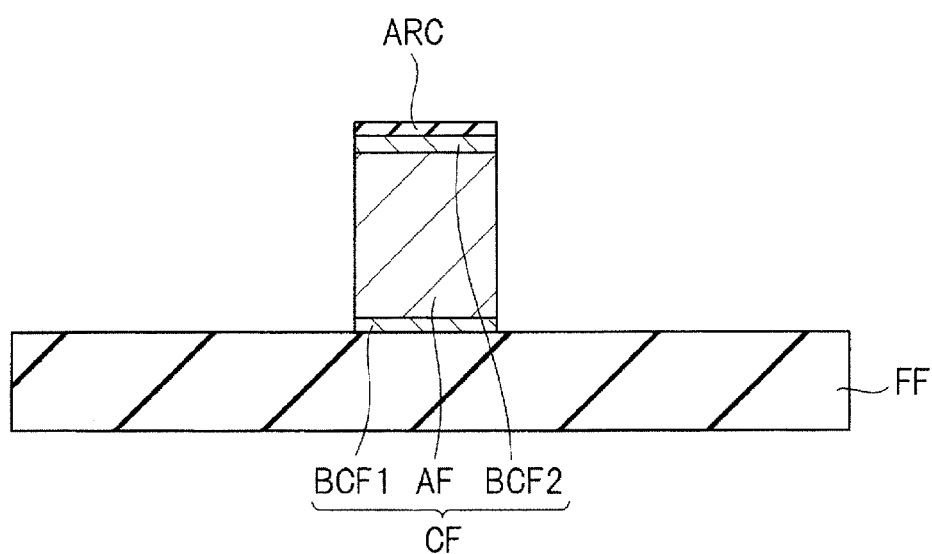
FIG. 18 is a sectional view explaining the step for removing the resist film following FIG. 17.

Successively as shown in FIG. 18, the sidewall polymer SWP is removed for example by using a chemical liquid comprising a mixed liquid of ammonium, acetic acid, and water, an aqueous solution of an ammonium fluoride base, or the like. In First Embodiment on this occasion, since a "polymer residual" comprising a component different from the sidewall polymer SWP is not formed, the sidewall polymer SWP formed over the side face of the conductor film CF is completely removed while the "polymer residual" does not remain by applying a step for removing the sidewall polymer SWP. In First Embodiment thereby, it is possible to inhibit the deterioration of the reliability of a semiconductor device caused by a degenerated "polymer residual". Then by applying passivation treatment to the exposed face of the patterned conductor film CF, the patterning of the conductor film CF in First Embodiment finishes.

<Modified Example>

A modified example of First Embodiment is explained hereunder. A feature of the modified example is that electric discharge starts in an oxygen gas after the oxygen gas is introduced into a processing room and further thereafter a water vapor is introduced into the processing room at a step for removing a resist film. The feature of the modified example is explained hereunder in reference to drawings.

Figure 19:
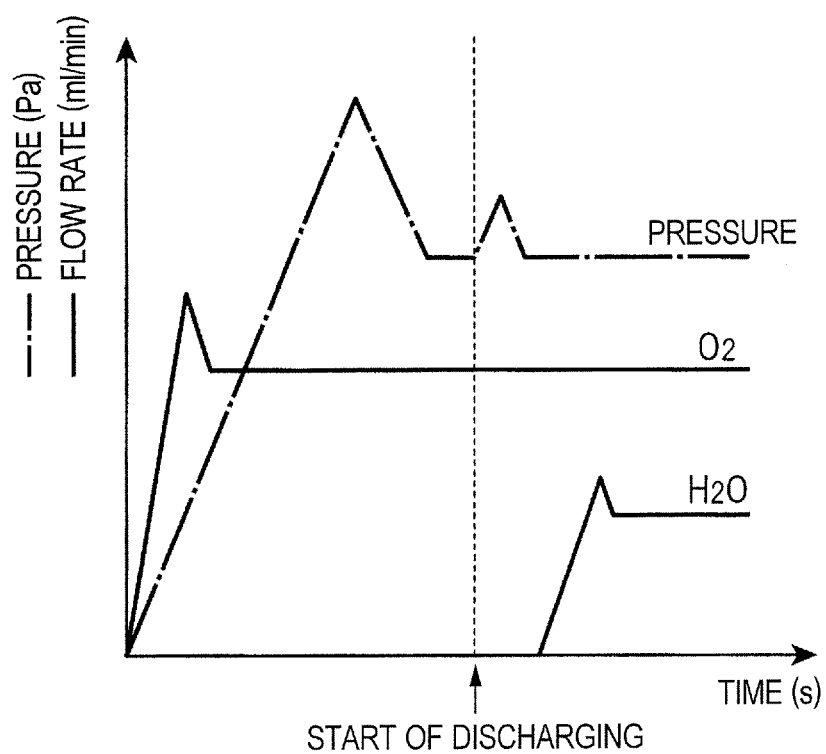
FIG. 19 is a graph showing the state of a gas introduced into a processing room at a step for removing a resist film in a modified example.

FIG. 19 is a graph showing the state of a gas introduced into a processing room at a step for removing a resist film in the modified example. As shown in FIG. 19, firstly an oxygen gas ($O_2$ gas) is introduced into a processing room at a step for removing a resist film in the modified example. Successively, when a pressure in the processing room is stabilized, electric discharge for transforming the oxygen gas into plasma starts and further thereafter a water vapor ($H_2O$) is introduced into the processing room. Then a resist film is removed by the oxygen gas having been transformed into plasma.

Figure 20:
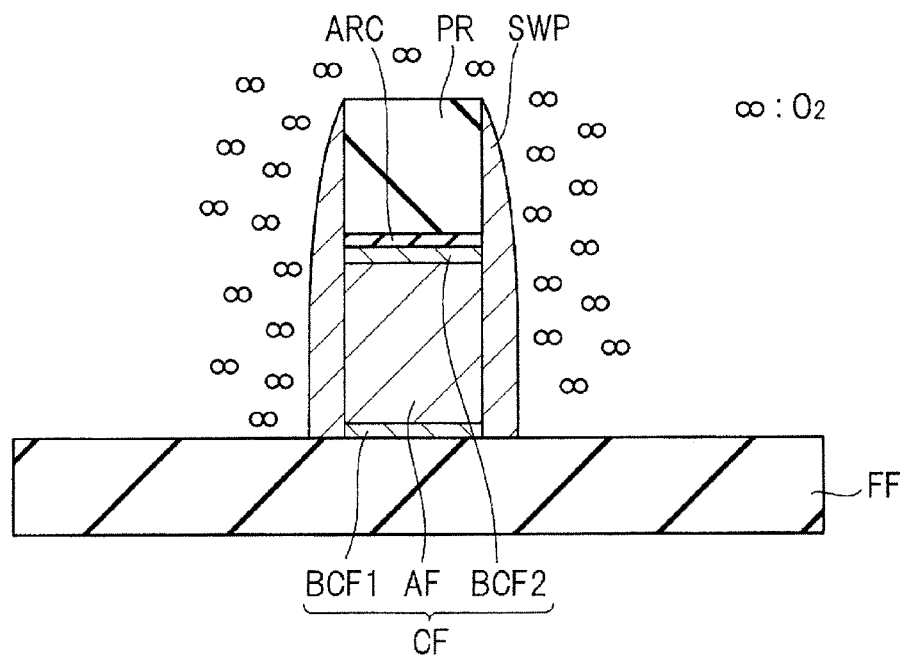
FIG. 20 is a sectional view explaining a step for removing a resist film in the modified example.

As shown in FIG. 20, similarly to First Embodiment, in the modified example too, a patterned conductor film CF is formed over a base film FF when the patterning of the conductor film CF finishes. The conductor film CF comprises for example: a barrier conductor film BCF1 comprising a titanium/titanium nitride film; an aluminum film AF formed over the barrier conductor film BCF1; and a barrier conductor film BCF2 comprising a titanium/titanium nitride film and being formed over the aluminum film AF. Then over the conductor film CF, for example an antireflection film ARC comprising a silicon oxynitride film is formed and a resist film PR is formed over the antireflection film ARC. Further, a sidewall polymer SWP is formed over the side face of the conductor film CF. Then a step for removing the resist film PR is applied in order to remove the resist film PR formed over the conductor film CF.

At a step for removing a resist film PR in the modified example, firstly a semiconductor substrate (semiconductor wafer) is carried in a processing room. Then an oxygen gas is introduced into the processing room in which the semiconductor substrate is carried. In FIG. 20, the situation where oxygen molecules configuring the oxygen gas are dispersing around a patterned conductor film CF and a resist film PR formed over the conductor film CF is shown schematically.

Figure 21:
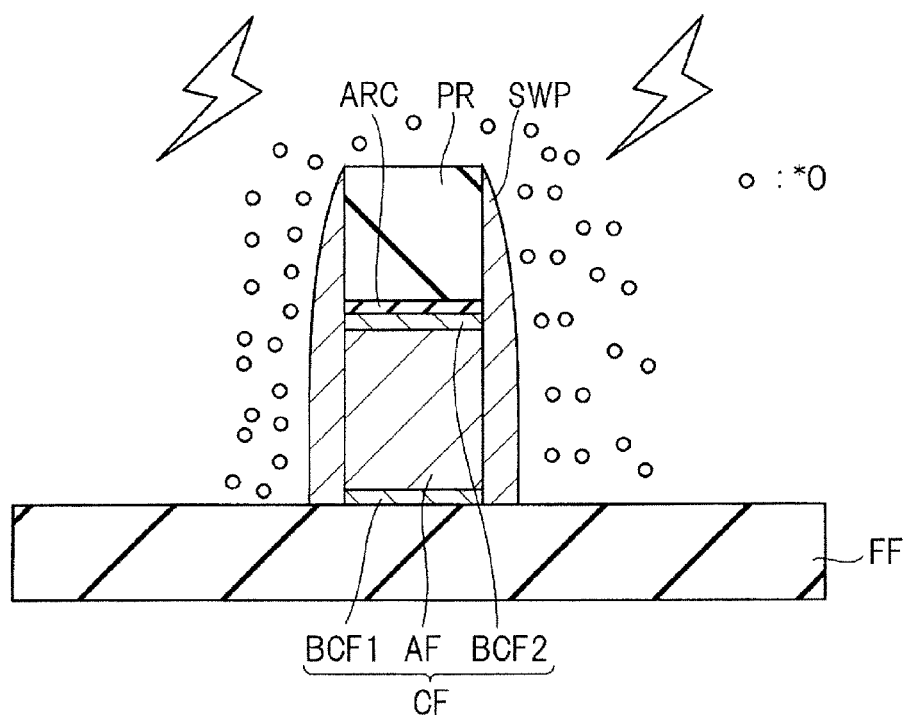
FIG. 21 is a sectional view explaining the step for removing the resist film following FIG. 20.
Figure 22:
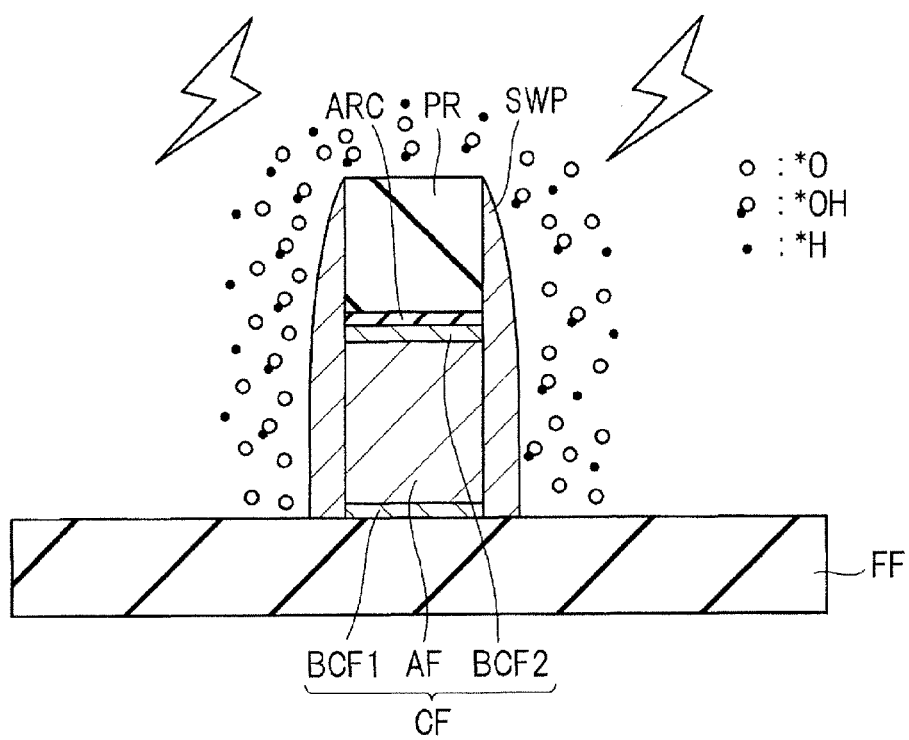
FIG. 22 is a sectional view explaining the step for removing the resist film following FIG. 21.

Successively as shown in FIG. 21, electric discharge (ignition) starts for transforming the oxygen gas introduced into the processing room into plasma. The oxygen gas is thereby transformed into plasma. In the modified example further, after the oxygen gas is transformed into plasma, a water vapor is introduced into the processing room as shown in FIG. 22. The water vapor is introduced into the processing room in the state of a vapor by heating or bubbling for example.

Figure 23:
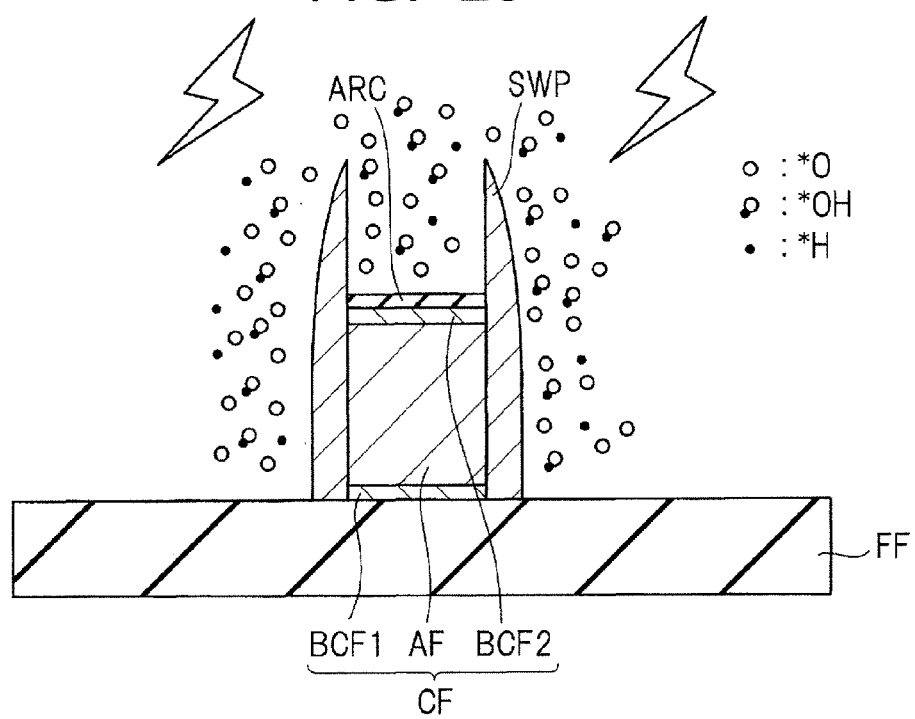
FIG. 23 is a sectional view explaining the step for removing the resist film following FIG. 22.

In the modified example too here, since the water vapor introduced into the processing room is instantaneously exposed to the plasma atmosphere, water molecules scarcely attach to the sidewall polymer SWP and dissociate into OH radicals and H radicals. In the modified example therefore, it is possible to inhibit a degenerated "polymer residual" from being formed in the sidewall polymer SWP. In the modified example this way, since O radicals (*O) are formed by transforming the oxygen gas into plasma and the water vapor is introduced into the processing room after a plasma atmosphere is formed by the oxygen gas transformed into plasma, as shown in FIG. 22 the water vapor receives energy from the plasma atmosphere instantaneously and dissociates into OH radicals (*OH) and H radicals (*H). As a result, as shown in FIG. 23, the resist film PR is removed by the O radicals, the OH radicals, and the H radicals. By those radicals further, the dehalogenation of halogen contained in the sidewall polymer SWP and the passivation of aluminum (Al) contained in the sidewall polymer SWP advance.

In the modified example, a water vapor is introduced into a processing room not at the same time as the transformation of an oxygen gas into plasma starts like First Embodiment but after the transformation of an oxygen gas into plasma starts. In the modified example therefore, since the water vapor is exposed to the already-generated plasma atmosphere surely when the water vapor is introduced into the processing room, water molecules scarcely attach to a sidewall polymer SWP and dissociate into OH radicals and H radicals. In the modified example therefore, it is possible to inhibit a degenerated "polymer residual" from being formed in the sidewall polymer SWP more surely than First Embodiment. That is, it can be thought that the modified example is superior to First Embodiment from the viewpoint of surely inhibiting a "polymer residual" caused by water molecules attaching to the sidewall polymer SWP.

Figure 24:
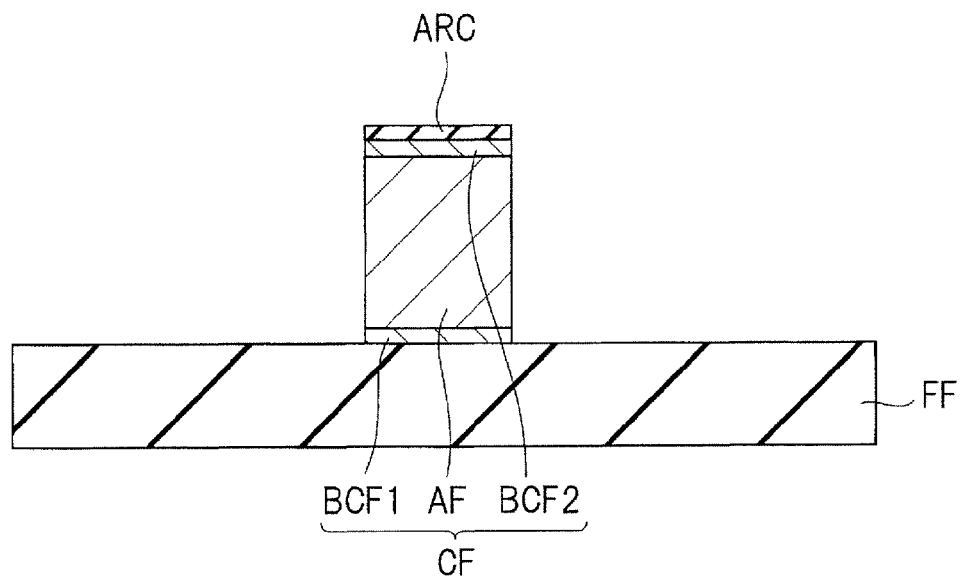
FIG. 24 is a sectional view explaining the step for removing the resist film following FIG. 23.

Successively as shown in FIG. 24, the sidewall polymer SWP is removed for example by using a chemical liquid comprising a mixed liquid of ammonium, acetic acid, and water, an aqueous solution of an ammonium fluoride base, or the like. In the modified example too on this occasion, since a "polymer residual" comprising a component different from the sidewall polymer SWP is not formed, the sidewall polymer SWP formed over the side face of the conductor film CF is completely removed while the "polymer residual" does not remain by applying a step for removing the sidewall polymer SWP. In the modified example too thereby, it is possible to inhibit the deterioration of the reliability of a semiconductor device caused by a degenerated "polymer residual". Then by applying passivation treatment to the exposed face of the patterned conductor film CF, the patterning of the conductor film CF in the modified example finishes.

<Application Example to Semiconductor Device>

Figure 25:
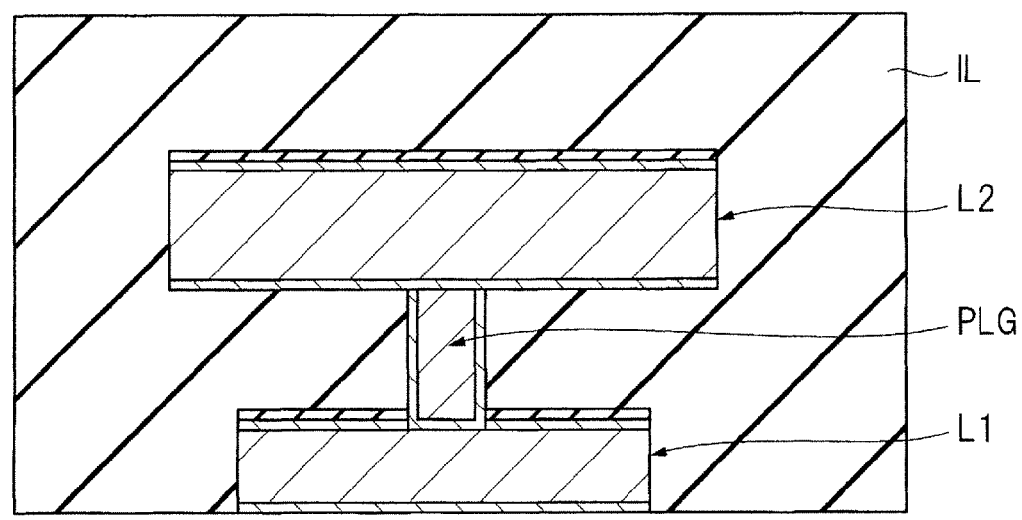
FIG. 25 is a sectional view showing an example of a wiring structure of a semiconductor device.

A step for patterning a conductor film CF in First Embodiment or the modified example can be widely applied for example to a wiring step of a semiconductor device including a wire containing aluminum as the main component. In FIG. 25 for example, an example of the wiring structure of a semiconductor device covered with an interlayer insulation film IL is shown. Concretely in FIG. 25, a wiring structure of electrically coupling a lower layer wire L1 containing aluminum as the main component and an upper layer wire L2 containing aluminum as the main component through a plug PLG containing tungsten as the main component is shown. The technological thought (patterning of a conductor film) according to First Embodiment and the modified example can be applied to the patterning of the lower layer wire L1 and the upper layer wire L2 shown in FIG. 25. As a result, it is possible to increase the reliability of the lower layer wire L1 and the upper layer wire L2 shown in FIG. 25.

Figure 26:
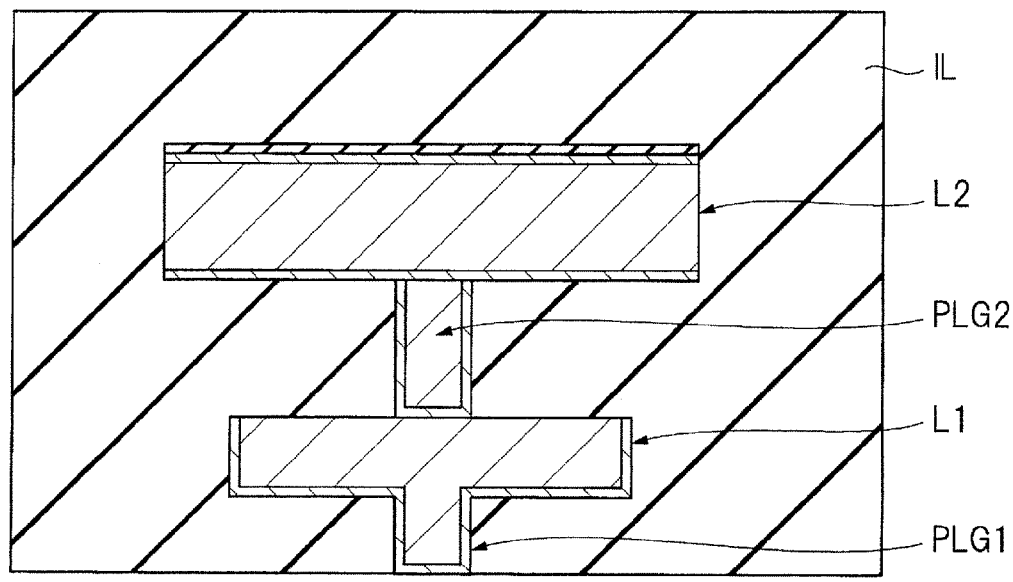
FIG. 26 is a sectional view showing another example of a wiring structure of a semiconductor device.

Further, in FIG. 26 for example, another example of the wiring structure of a semiconductor device covered with an interlayer insulation film IL is shown. Concretely in FIG. 26, a wiring structure of electrically coupling a plug PLG1 and a lower layer wire L1, those containing copper as the main component and being formed by a "damascene method", and an upper layer wire L2 containing aluminum as the main component through a plug PLG2 containing tungsten as the main component is shown. On this occasion, the technological thought (patterning of a conductor film) according to First Embodiment and the modified example can be applied to the patterning of the upper layer wire L2 shown in FIG. 26. As a result, it is possible to increase the reliability of the upper layer wire L2 shown in FIG. 26.

(Second Embodiment)

In First Embodiment, explanations have been made on the basis of an example of introducing a water vapor as a gas having the function of improving corrosion resistance by dehalogenating halogen contained in a sidewall polymer SWP and passivating aluminum (Al) contained in the sidewall polymer SWP in addition to an oxygen gas at a step for removing a resist film PR. In Second Embodiment, an example of introducing an alcohol vapor having the same function in place of a water vapor stated above is explained.

At a step for removing a resist film PR for example, there is the case of introducing not a water vapor but an alcohol vapor represented by a methanol vapor ($CH_3OH$) or an ethanol vapor ($C_2H_5OH$) in addition to an oxygen gas. Also in the case, it is estimated that alcohol molecules for example attach to the surface of a sidewall polymer SWP and the sidewall polymer SWP absorbs the alcohol molecules, thereby swells, and are degenerated. Then it can be estimated that a polymer residual KP degenerated from the sidewall polymer SWP is formed by absorbing the alcohol molecules at a part of the sidewall polymer SWP.

Consequently to a step for removing a resist film PR according to Second Embodiment too, the technological thought explained in First Embodiment and the modified example is usefully applicable. That is, a manufacturing method of a semiconductor device according to Second Embodiment includes the steps of: (a) providing a semiconductor wafer over which a conductor film containing aluminum as the main component is formed; (b) forming a resist film over the conductor film; and (c) patterning the resist film. Then the manufacturing method of the semiconductor device according to Second Embodiment further includes the steps of: (d) patterning the conductor film by etching with the patterned resist film used as a mask; and (e) removing the patterned resist film. On this occasion, the step (d) includes the steps of: (d1) carrying the semiconductor wafer in a processing room; and (d2) introducing at least an etching gas for etching the conductor film and a gas for forming a sidewall polymer with which the side face of the conductor film being patterned is covered into the processing room and etching the conductor film. Further, the step (e) includes the steps of: (e1) introducing at least a gas containing oxygen into the processing room, (e2) starting electric discharge for transforming the gas containing oxygen into plasma, and (e3) introducing an alcohol vapor represented by a methanol vapor or an ethanol vapor into the processing room. On this occasion, the step (e3) is applied either simultaneously with or after the step (e2). In Second Embodiment too thereby, a degenerated "polymer residual" is not formed in the sidewall polymer SWP at the step for removing the resist film PR and hence it is possible to increase the reliability of the semiconductor device.

Although the invention attained by the present inventors has heretofore been explained concretely on the basis of the embodiments, it goes without saying that the present invention is not limited to the embodiments and can be modified variously within the range not deviating from the tenor thereof.

What is claimed is:

1. A manufacturing method of a semiconductor device comprising the steps of:
   (a) providing a semiconductor wafer over which a conductor film containing aluminum as the main component is formed;
   (b) forming a resist film over said conductor film;
   (c) patterning said resist film;
   (d) patterning said conductor film by etching with said patterned resist film used as a mask; and
   (e) removing said patterned resist film,
   wherein said step (d) includes the steps of:
   (d1) carrying said semiconductor wafer in a processing room; and
   (d2) introducing at least an etching gas for etching said conductor film and a gas for forming a sidewall polymer with which the side face of said conductor film being patterned is covered into said processing room and etching said conductor film,
   wherein said step (e) includes the steps of:
   (e1) introducing at least a gas containing oxygen into said processing room;
   (e2) starting electric discharge for transforming said gas including oxygen into plasma; and
   (e3) introducing a water vapor into said processing room,
   wherein said step (e3) is applied either simultaneously with or after said step (e2), and
   wherein said conductor film comprises a film containing aluminum as the main component and barrier conductor films interposing said film.

2. A manufacturing method of a semiconductor device according to claim 1, wherein said manufacturing method includes the steps of:
   (f) removing said sidewall polymer after said step (e).

3. A manufacturing method of a semiconductor device according to claim 2, including a step of:

(g) after said step (f), applying passivation treatment to the exposed face of said patterned conductor film.

4. A manufacturing method of a semiconductor device according to claim 3, wherein said step (g) is applied by introducing an oxygen gas or an ozone gas around said semiconductor wafer.

5. A manufacturing method of a semiconductor device according to claim 1, wherein said conductor film includes any one of an Al film, an AlSi film, and an AlSiCu film.

6. A manufacturing method of a semiconductor device according to claim 1, wherein said etching gas includes any one of a $Cl_2$ gas, a $BCl_3$ gas, and a $CCl_4$ gas.

7. A manufacturing method of a semiconductor device according to claim 1, wherein said gas for forming said sidewall polymer includes either of a $CH_4$ gas and a $C_2H_4$ gas.

8. A manufacturing method of a semiconductor device according to claim 1, wherein an Ar gas functioning as a dilution gas is also introduced into said processing room at said step (d2).

9. A manufacturing method of a semiconductor device according to claim 1, wherein a gas containing fluorine having the function of increasing the speed for removing said resist film further than the case of not introducing said gas is introduced into said processing room at said step (e1).

10. A manufacturing method of a semiconductor device according to claim 1, wherein a gas containing nitrogen having the function of increasing the breadth of said electric discharge further than the case of not introducing said gas is introduced into said processing room at said step (e1).

* * * * *